United States Patent
Lee et al.

(10) Patent No.: US 11,191,143 B2
(45) Date of Patent: Nov. 30, 2021

(54) DRIVER SYSTEM

(71) Applicant: Yu-Lin Lee, New Taipei (TW)

(72) Inventors: Yu-Lin Lee, New Taipei (TW);
Kuo-Chung Huang, New Taipei (TW)

(73) Assignee: Yu-Lin Lee, New Taipei (TW)

( * ) Notice: Subject to any disclaimer, the term of this patent is extended or adjusted under 35 U.S.C. 154(b) by 2 days.

(21) Appl. No.: 16/471,046

(22) PCT Filed: May 27, 2017

(86) PCT No.: PCT/CN2017/086272
§ 371 (c)(1),
(2) Date: Jun. 19, 2019

(87) PCT Pub. No.: WO2018/218400
PCT Pub. Date: Dec. 6, 2018

(65) Prior Publication Data
US 2020/0022237 A1    Jan. 16, 2020

(51) Int. Cl.
*H05B 47/10* (2020.01)
*H05B 45/10* (2020.01)
*H05B 47/17* (2020.01)
*H03J 9/06* (2006.01)

(52) U.S. Cl.
CPC .............. *H05B 47/10* (2020.01); *H05B 45/10* (2020.01); *H05B 47/17* (2020.01); *H03J 9/06* (2013.01)

(58) Field of Classification Search
CPC ........ H05B 47/10; H05B 45/10; H05B 47/17; H03J 9/06
See application file for complete search history.

(56) References Cited

U.S. PATENT DOCUMENTS

| 4,045,777 A | 8/1977 | Mierzwinski et al. |
| 4,151,481 A | 4/1979 | Funston et al. |
| 4,901,003 A | 2/1990 | Clegg |

(Continued)

FOREIGN PATENT DOCUMENTS

| CN | 1087034 | 5/1994 |
| CN | 101197108 | 6/2008 |

(Continued)

OTHER PUBLICATIONS

Taiwan Search Report for Application No. 106117768.

(Continued)

*Primary Examiner* — Minh D A
(74) *Attorney, Agent, or Firm* — Demian K. Jackson; Jackson IPG PLLC (57) ABSTRACT

The present invention relates to a driver system, comprising a counter unit, a buffer unit and a voltage regulation unit. The counter unit is adapted to sequentially activate one of the first output terminals upon receiving a driver signal and then output a control signal according to the driver signal. The buffer unit is adapted to output an isolated control signal upon receiving the control signal from the counter unit. Upon receiving the isolated control signal, the voltage regulation unit outputs a control voltage which corresponds to a given resistor provided therein. The control voltage is useful in driving an electronic device, and the operation of the electronic device may be further adjusted by changing the control voltage from one level to another.

19 Claims, 7 Drawing Sheets

(56) References Cited

U.S. PATENT DOCUMENTS

| | | |
|---|---|---|
| 5,450,068 A | 9/1995 | Steffen |
| 5,459,489 A | 10/1995 | Redford |
| 5,839,816 A | 11/1998 | Varga et al. |
| 6,107,981 A * | 8/2000 | Fujita .............. G09G 3/3696 345/95 |
| 6,160,490 A | 12/2000 | Pace et al. |
| 6,597,598 B1 | 7/2003 | Tran et al. |
| 7,268,830 B2 | 9/2007 | Lee |
| 8,110,997 B2 | 2/2012 | Muramatsu |
| 2006/0139451 A1 | 6/2006 | Yoneno |
| 2007/0096563 A1 | 5/2007 | Athuri et al. |
| 2008/0292344 A1 | 11/2008 | Nagumo |
| 2009/0322255 A1 | 12/2009 | Lin |
| 2010/0079081 A1 | 4/2010 | Zhang et al. |
| 2010/0308749 A1 | 12/2010 | Liu |
| 2011/0012536 A1 | 1/2011 | Lin et al. |
| 2011/0050110 A1 | 3/2011 | Han |
| 2011/0109249 A1 | 5/2011 | Liu et al. |
| 2011/0128303 A1 * | 6/2011 | Yonemaru ............ H05B 45/385 345/690 |
| 2012/0119674 A1 | 5/2012 | Lee et al. |
| 2012/0306826 A1 * | 12/2012 | Tsuchi ................ G09G 3/3688 345/204 |
| 2016/0119995 A1 * | 4/2016 | Han ................... H05B 45/3725 315/193 |

FOREIGN PATENT DOCUMENTS

| | | |
|---|---|---|
| CN | 101621878 | 1/2010 |
| CN | 101621878 A | 1/2010 |
| CN | 102052592 A | 5/2011 |
| CN | 102173281 A | 9/2011 |
| CN | 201986225 | 9/2011 |
| CN | 102333400 | 1/2012 |
| CN | 103066850 A | 4/2013 |
| CN | 103152905 | 6/2013 |
| CN | 204119627 U | 1/2015 |
| CN | 105050265 A | 11/2015 |
| CN | 105826898 | 8/2016 |
| CN | 103428962 B | 10/2016 |
| CN | 106612577 | 5/2017 |
| CN | 108966407 A | 12/2018 |
| DE | 39 91 599 | 9/1990 |
| EP | 2498579 A2 | 12/2012 |
| GB | 2 193 939 | 2/1988 |
| JP | 01-107496 | 4/1989 |
| JP | 1-160146 | 6/1989 |
| JP | H03-1487 | 1/1991 |
| JP | H06-203968 | 7/1994 |
| JP | 2006054280 | 2/2006 |
| JP | 2006-166189 | 6/2006 |
| JP | 2005284691 A | 10/2006 |
| JP | 3135483 U | 9/2007 |
| JP | 135138 A | 6/2009 |
| JP | 015728 A | 1/2010 |
| JP | 2013-164932 | 8/2013 |
| KR | 100625705 | 9/2006 |
| KR | 0101355 | 9/2010 |
| TW | M393951 | 12/2010 |
| TW | 201218862 | 5/2012 |
| TW | I387396 | 2/2013 |
| TW | I628975 | 7/2018 |

OTHER PUBLICATIONS

International Search Report for Application No. PCT/CN2017/086272.
Taiwan Search Report for Application No. 107115079.
Japanese Office Action for Application No. 2018-098540.
U.S. Office Action for U.S. Appl. No. 15/988,536.
European Search Report for Application No. EP17911682.7 dated Jul. 13, 2020.
Japanese Office Action for Application No. JP2019-531889 dated Jun. 2, 2020.
Korean Office Action for Application No. KR10-2019-7012768 dated May 27, 2020.
Singapore Office Action for Application No. 11201909492W dated Apr. 23, 2020.
European Search Report for Application No. dated Sep. 10, 2019.
Japanese Office Action for Application No. JP2019-079973 dated Jul. 14, 2020.
Korean Office Action for Application No. KR10-2019-0050390 dated May 21, 2020.
Taiwan Office Action for Application No. TW 108112752 dated Nov. 5, 2019.
US Office Action for U.S. Appl. No. 16/400,075, filed May 1, 2019.
HS0201-0001-CN-1 1stOA SR issued Oct. 14, 2020.
HS0201-0009-CN-1 1stOA issued Jun. 3, 2021.
HS0201-0009-IN-1 1stOA issued Dec. 4, 2020.
HS0201-0009-US-1 3rdOA issued Jun. 3, 2021.

* cited by examiner

DRIVER SYSTEM

PRIORITY CLAIM CROSS REFERENCE TO RELATED APPLICATIONS

This application is a 371 of International Application No. PCT/CN2017/086272 filed May 27, 2017, the entirety of which is hereby incorporated by reference in their entirety.

BACKGROUND OF THE INVENTION

1. Field of the Invention

The present invention relates to a driver system, in which a simple circuit architecture is used to output a control voltage following the counting sequence of a counter unit, thereby shifting the operation of an electrical device from one operation state to another.

2. Description of Related Art

Light-emitting diodes (abbreviated hereafter as LEDs) are a type of luminous semiconductor electronic devices developed as early as in 1962. They can only emit red light with low brightness in the early days and were later on developed to function as the light sources for emitting monochromatic light other than red light. Nowadays, LEDs are available in many wavelengths for emitting visible light, infrared light and ultraviolet light, and the brightness thereof has been raised to a relatively high level. Initially, LEDs were only used in indicator lights, display panels and so on. With the emergence of white light LEDs, they have been used in different lighting devices universally. For example, high-brightness LEDs have been widely used in traffic lights, vehicle indicator lights, and brake lights. In recent years, lighting devices provided with high-voltage LED light bars have been developed to replace conventional incandescent light bulbs and fluorescent light bulbs. The LED lighting devices are preferred to have a dimming function, so as to satisfy users' demand for brightness adjustment and meet the energy-saving requirement. To achieve this, the LED light devices are normally provided with a light dimmer circuit controlled by a swivel switch. Wireless remote control systems, aiming to adjust the operation of lighting devices by using remote control units, have reached the market. To achieve the purpose of adjusting the operation of an LED lighting device in a convenient way, the conventional wireless remote control systems typically include a plurality of LED light sources; a control unit for controlling the LED light sources; a remote signal receiver unit electrically connected to the control unit; and a remote control unit.

Conventional dimming device with wireless remote control function are disclosed in, for example, R.O.C. Patent No. M394408 entitled "Illumination System," R.O.C. Patent No. M383886 entitled "LED Lamp System with Automatic and Manual Dimming Function," R.O.C. Patent No. M380683 entitled "Built-In Wireless Dimming Device," R.O.C. Patent No. M263688 entitled "Remote Control Dimming Device" and R.O.C. Patent No. M252234 entitled "Remote Control Dimming Device for Use in White-Light LED Illumination Lamp". However, they have the following disadvantages.

1. For typical remote control techniques including infrared transmission and Bluetooth technology, the transmitter and the receiver need to be paired with each other, that is, the receiver will only respond to the remote control signal from the transmitter that is paired with. Therefore, the user still has to use a specific or paired remote control to control the operation state of the lighting device wirelessly.

2. The conventional remote control also requires a decoding scheme or a demodulation function, which can decode or demodulate the received remote control signal to form a corresponding response, which may involve a programmed control unit for establishing the required action program and executing the program based upon the received remote control signal. Therefore, the overall circuit design is complicated and costly.

SUMMARY OF THE INVENTION

According to the invention, a primary object is to provide a driver system, where a simple circuit architecture is used to output a control voltage following the counting sequence of a counter unit, thereby shifting the operation of an electrical device from one operation state to another.

In one aspect provided herein is a driver system comprises a counter unit, a buffer unit, and a voltage regulation unit. The counter unit is adapted to sequentially activate one of the first output terminals thereof upon receiving a driver signal and then output a control signal according to the driver signal. The buffer unit is adapted to output an isolated control signal upon receiving the control signal from the counter unit. Upon receiving the isolated control signal, the voltage regulation unit outputs a control voltage which corresponds to a given resistor provided therein. The control voltage is useful in driving an electronic device, and the operation of the electronic device may be further adjusted by changing the control voltage from one level to another.

In another aspect provided herein is a driver system comprises a counter unit, an operational amplifier unit, and a voltage regulation unit. The counter unit is adapted to sequentially activate one of the first output terminals thereof upon receiving a driver signal and then output a control signal according to the driver signal. The voltage regulation unit comprises a plurality of resistors, through which the control signal from the activated first output terminal is transmitted to the operational amplifier unit and subjected to computation, so that a specific control voltage is output. The control voltage is useful in driving an electronic device, and the operation of the electronic device may be further adjusted by changing the control voltage from one level to another.

The invention mainly involves utilization of a simple circuit architecture to develop a driver system that is adapted to output a control voltage following a predetermined counting sequence, such that the electrical device receiving the control voltage is driven to shift its operation state from one state to another. For instance, the driver system disclosed herein is useful in driving a light source module of a lighting device, and different levels of control voltages are responsible for placing the light source module at corresponding operation states (such as ON and OFF, brightness, and color temperature, etc.). Alternatively, the driver system disclosed herein is useful in regulating the operational state of a motor (such as its rpm).

According to the preferred embodiments, the driver system disclosed herein further comprises a wireless receiver unit and a filter unit. The wireless receiver unit is adapted to receive a wireless signal. The wireless signal is filtered through the filter unit based on a specific frequency range, so that the infrared signal that need be decoded according to the infrared protocols is filtered out to generate a driving signal which is then transmitted to the counter unit. The driving signal generated after filtering is transmitted to the counter unit, allowing the first output terminals of the counter unit to be sequentially activated to output a control signal following the predetermined counting sequence. By using the driver system disclosed herein, a broad variety of remote control units may be used to dim the brightness of light emitted from a lighting device without pairing the remote control units with the lighting device, and no decoding or demodulation process is required. That is to say, a user may simply press any key on a remote control unit to achieve the purpose of controlling the operation of the lighting device.

According to the preferred embodiments, the driver system disclosed herein further comprises a driver unit for driving a light source module. The driver unit comprises a rectifier circuit for connecting an AC power source and converting the AC power source into a DC power source, and a switching power supply having a primary side and a secondary side. The primary side is connected to the rectifier circuit and the voltage regulation unit. The secondary side is adapted to supply a predetermined voltage to drive the light source module.

According to the preferred embodiments, the driver system disclosed herein further comprises a driver unit for driving a light source module. The driver unit comprises a rectifier circuit for connecting an AC power source and converting the AC power source into a DC power source; a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a predetermined voltage upon receiving the constant voltage and the control voltage; and a constant current circuit comprising a transistor and a resistor connected in series with the transistor, wherein the transistor is adapted to drive the light source module upon receiving the predetermined voltage.

According to the preferred embodiments, the driver system disclosed herein further comprises a driver unit for driving a light source module. The driver unit comprises a rectifier circuit for connecting an AC power source and converting the AC power source into a DC power source; a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a reference voltage upon receiving the constant voltage and the control voltage; a voltage regulation circuit comprising a first resistor and a second resistor connected in series, and a second operational amplifier, wherein the serially connected first and second resistors are adapted to receive and divide the DC power source into a divided voltage, and the second operational amplifier is adapted to output a predetermined voltage upon receiving the reference voltage and the divided voltage; and a constant current circuit comprising a transistor and a resistor connected in series with the transistor, wherein the transistors are adapted to drive the light source module upon receiving the predetermined voltage.

According to the preferred embodiments, the first operational amplifier and the second operational amplifier comprise a differential amplifier, respectively.

According to the preferred embodiments, the counter unit comprises a Johnson counter.

According to the preferred embodiments, the buffer unit comprises 3-state buffers.

According to the preferred embodiments, the operational amplifier unit comprises a summing amplifier.

DETAILED DESCRIPTION OF THE INVENTION

The above and other objects, features and effects of the invention will become apparent with reference to the following description of the preferred embodiments taken in conjunction with the accompanying drawings.

Figure 1:
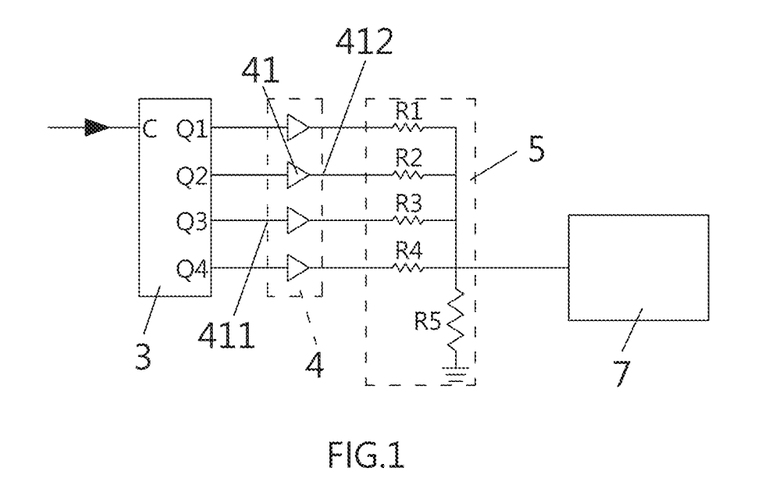
FIG. 1 is a schematic diagram showing the circuit of the driver system according to the first embodiment of the invention.

FIG. 1 is a schematic diagram showing the circuit of the driver system according to the first embodiment of the invention. The driver system disclosed herein comprises a counter unit 3, a buffer unit 4, and a voltage regulation unit 5.

The counter unit 3 includes a first input terminal C adapted to receive a driving signal and a plurality of first output terminals Q1, Q2, Q3, and Q4. Responsive to receiving the driving signal, the counter unit 3 sequentially activates the first output terminals Q1, Q2, Q3, and Q4, one at a time, following a predetermined counting sequence, thereby outputting a control signal. The counter unit 3 may comprise a Johnson counter and is adapted to sequentially output control signals from the output terminals Q1, Q2, Q3, and Q4 according to the received driving signal. It is known in the art that the number of first output terminals is not limited to that described herein, and additional counter unit(s) may be included in the device. A plurality of counter units can be connected in series to constitute more first output terminals.

The buffer unit 4 is electrically connected to the counter unit 3 and comprises a plurality of 3-state buffers 41 connected to the first output terminals Q1, Q2, Q3, Q4 of the counter unit 3, respectively. Each of the 3-state buffers 41 includes a second input terminal 411 connected to one of the first output terminals Q1, Q2, Q3, Q4 to receive the control signal, and a second output terminal 412 adapted to output an isolated control signal.

The voltage regulation unit 5 includes a plurality of resistors R1~R5 connected to the second output terminals 412, respectively, and adapted to output a corresponding control voltage according to the isolated control signal. The resistors R1~R4 connected in series to the second output terminals 412 are connected in parallel with each other and connected in series with the resistor R5, allowing the resistors R1, R2, R3 and R4 to generate different levels of control voltages in collaboration with the resistor R5.

Upon receipt of a driving signal via the first input terminal C, the counter unit 3 sequentially activates the first output terminals Q1, Q2, Q3, Q4, one at a time, following the predetermined counting sequence, thereby outputting a control signal. The control signal output from the activated one of the first output terminals Q1, Q2, Q3, Q4 is transmitted to the 3-state buffer 41 coupled to the activated first output terminal. At the time, in light of the characteristic property of the 3-state buffers 41, the second output terminals 412 not receiving the control signal are in a high impedance state, resulting in isolation of the second output terminals 412 from the 3-state buffers 41, while the 3-state buffer 41 receiving the control signal directly transmits the control signal to the voltage regulation unit 5. As the 3-state buffers 41 not receiving the control signal are in a high impedance state, the control signal is transmitted to the voltage regulation unit 5 without interference. Afterwards, the isolated control signal is transmitted to the resistor connected to the 3-state buffer 41 receiving the control signal, and the conducted resistor outputs a corresponding control voltage for driving an electrical device 7.

Figure 2:
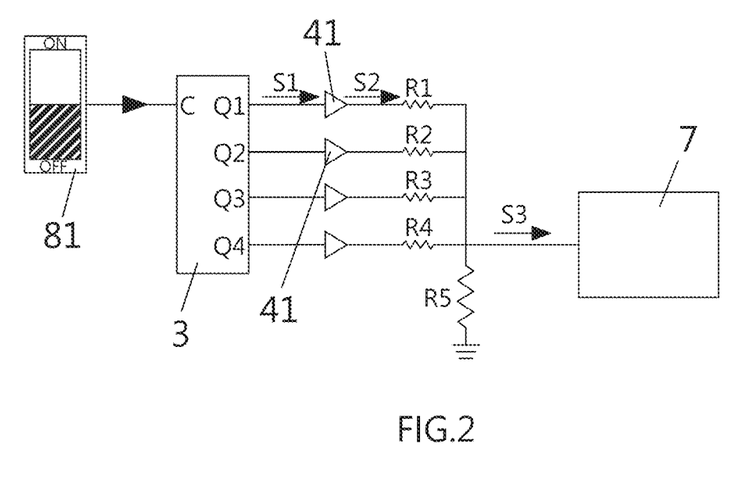
FIG. 2 is a schematic diagram showing the operation of the driver system according to the invention.

In use, the driver system according to the invention may be controlled in a wired or wireless manner. For example, according to the embodiment shown in FIG. 2, the counter unit 3 is connected to a switch 81 through a wired connection. By switching the switch 81, a driving signal is generated. The driving signal is received by the first input terminal C of the counter unit 3. Responsive to receiving the driving signal, the counter unit 3 sequentially activates the first output terminals Q1, Q2, Q3, Q4, one at a time, following a predetermined counting sequence, thereby outputting a control signal. For instance, when the switch 81 is pressed once, the driving signal thus generated activates the first output terminal Q1 to output a control signal. Alternatively, when the switch 81 is successively pressed twice, the driving signal thus generated activates the first output terminal Q2 to output a control signal. In the case where the switch 81 is pressed once, the driving signal thus generated activates the first output terminal Q1 to output a control signal S1, which is then transmitted to the 3-state buffer 41 connected to the first output terminal Q1. Afterwards, the isolated control signal S2 is transmitted to the resistor connected to the 3-state buffer 41. By virtue of the conducted resistors R1 and R5, a corresponding control voltage S3 is generated, and the electronic device 7 is then driven according to the control voltage S3. The driver system according to the invention may perform to shift the operation of an electrical device from one state to another based on user's demands, without conducting any decoding or demodulation process.

Figure 3:
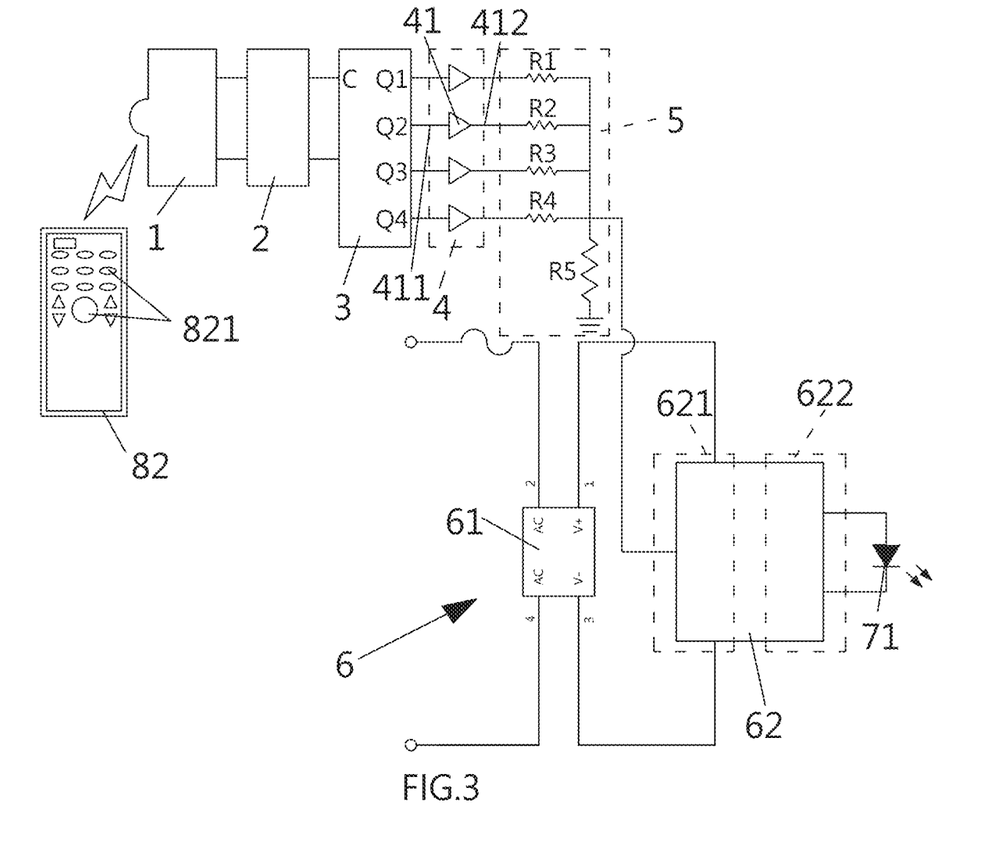
FIG. 3 is a schematic diagram showing the circuit of the driver system according to the second embodiment of the invention.

The driver system disclosed herein may also be controlled in a wireless manner. According to the embodiment shown in FIG. 3, the driver system disclosed herein further comprises a wireless receiver unit 1 and a filter unit 2. The wireless receiver unit 1 is adapted to receive a wireless signal. The wireless signal is filtered through the filter unit 2 based on a specific frequency range, so that a driving signal is generated and transmitted to the counter unit 3. In the embodiments disclosed herein, the wireless receiver unit 1 is adapted to function based on the infrared transmission technology, and the filter unit 2 is adapted to filter out the infrared signal that need be decoded according to the infrared protocols. The filter unit 2 may be a capacitor. The driver system disclosed herein may further comprise a driver unit 6 for driving the electronic device 7. As shown, the driver unit 6 is electrically connected to the voltage regulation unit 5 and adapted to output a predetermined voltage for driving the electronic device 7 according to the control voltage. The electronic device 7 may be a light source module 71 of a lighting device. As shown in FIG. 3, the light source module 71 may include at least one light-emitting diode.

In use, the driver system disclosed herein is used in collaboration with a remote control unit 82. As shown, the remote control unit 82 is adapted to function using the infrared transmission technology, which may by way of example be any appliance remote controller commonly used at home. A user may press a key 821 on the remote control unit 82 to send out a driving signal. The transmission of the driving signal is based on a transmission protocol which may vary from one remote controller to another, and pressing different keys 821 will send out different coded signals. The lighting device receives the driving signal via the wireless receiver unit 1, and the filter unit 2 is adapted to filter out the infrared signal that need be decoded according to the infrared protocols. After filtering, the driving signal is transmitted to the counter unit 3.

The driving signal is received by the first input terminal C of the counter unit 3, and the first output terminals Q1, Q2, Q3 and Q4 are sequentially activated to output control signals following the predetermined counting sequence. For example, the driving signal generated by pressing a key 821 once activates the first output terminal Q1 to output a control signal, whereas the driving signal generated by successively pressing the key 821 twice activates the first output terminal Q2 to output a control signal. In the case where a key 821 is pressed once and the first output terminal Q1 is activated to output a control signal, the control signal is transmitted to the 3-state buffer 41 coupled to the first output terminal Q1, and the isolated control signal thus generated is then transmitted to the resistor connected to the output terminal Q1, thereby outputting a corresponding control voltage to the driver unit 6 which in turn outputs a predetermined voltage for driving the light source module 71 according to the control voltage.

For example, pressing a key once may place the light source module to be at its maximum brightness state. Alternatively, successively pressing the key twice may cause light source module to emit light with maximum brightness and then decrease the brightness by 20%. Still alternatively, successively pressing the key three times will at first turn on light source module with maximum brightness, followed by decreasing the brightness by 20%, and then further decreases the brightness by 20%. By using the driver system disclosed herein, a broad variety of remote control units may be used to control the operation of light source module (including the operation states of ON and OFF, brightness, and color temperature, etc.) without pairing the remote control units with the receiver unit, and no decoding or demodulation process is required. A user may simply press any key on a remote control unit to dim the brightness of light emitted from the light source module.

It is apparent to those having ordinary skill in the art that the remote control unit 82 is described in the embodiments above for illustration purposes only and may be alternatively configured in the form of a smart phone or a tablet computer, and that the driver system disclosed herein may be controlled wirelessly through infrared transmission, thereby adjusting the operation state of a light source module (including the operation states of ON and OFF, brightness, and color temperature, etc.), regulating the operational state of a motor (such as changing its rpm) or controlling the operation state of other voltage-driven electronic devices.

As shown in FIG. 3, the driver unit described above includes a rectifier circuit 61 and a switching power supply 62. The rectifier circuit 61 is adapted for connection to an AC power source and for converting the AC power source into a DC power source. The switching power supply 62 has a primary side 621 and a secondary side 622. The primary side 621 is connected with the rectifier circuit 61 and the voltage regulation unit 5, and is connected in parallel with the voltage regulation unit 5. The secondary side 622 is adapted to output a predetermined voltage for driving the light source module 71.

Figure 4:
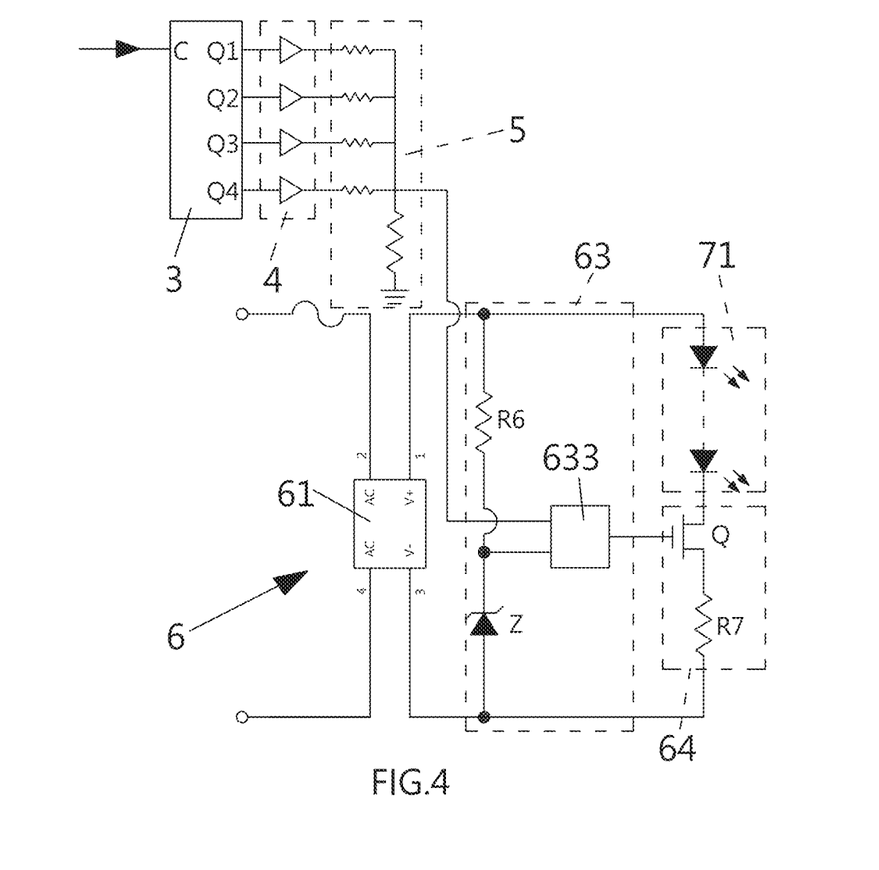
FIG. 4 is a schematic diagram showing the circuit of the driver unit according to the third embodiment of the invention.

FIG. 4 is a schematic diagram showing the circuit of the driver unit according to the third embodiment of the invention. The driver unit comprises a rectifier circuit 61, a voltage stabilization circuit 63 and a constant current circuit 64. The voltage stabilization circuit 63 includes a resistor R6, a Zener diode Z connected in series with the resistor R6, and a first operational amplifier 633. The serially connected resistor R6 and Zener diode Z are electrically connected to the rectifier circuit 61 to receive the DC power source, thereby generating a constant voltage based on the DC power source. The first operational amplifier 633 is adapted to output a predetermined voltage upon receiving the constant voltage and the control voltage. The constant current circuit 64 includes a transistor Q and a resistor R7 connected in series. The constant current circuit 64 is connected in series with the light-emitting diodes mounted in the light source module 71. The transistor Q is adapted to drive the light source module 71 upon receiving the predetermined voltage, so that the electric current flowing to the light-emitting diodes is limited to a fixed level.

Figure 5:
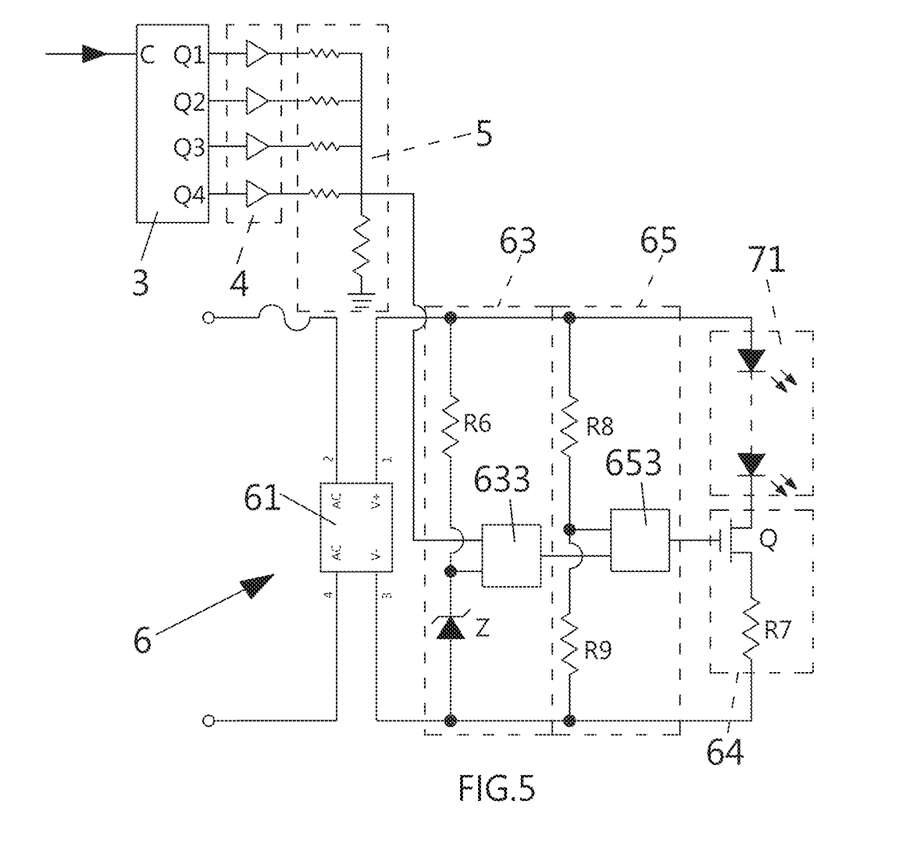
FIG. 5 is a schematic diagram showing the circuit of the driver unit according to the fourth embodiment of the invention.

FIG. 5 is a schematic diagram showing the circuit of the driver unit according to the fourth embodiment of the invention. The driver unit disclosed in the third embodiment differs from the embodiments described above in the provision of a voltage regulation circuit 65, which comprises a first resistor R8 and a second resistor R9 connected in series, and a second operational amplifier 653. The voltage stabilization circuit 63 is adapted to generate a constant voltage based on the DC power source, and the first operational amplifier 633 is adapted to output a reference voltage upon receiving the constant voltage and the control voltage. The serially connected first resistor R8 and second resistor R9 are adapted to receive and divide the DC power source into a divided voltage, and the second operational amplifier 653 is adapted to output a predetermined voltage to the transistor Q of the constant current circuit 64 upon receiving the reference voltage and the divided voltage. The second resistor R9 may also be a variable resistor, which allows manually adjusting the brightness of the light source module by changing the resistance of the variable resistor.

The first operational amplifier and the second operational amplifier described above may comprise a differential amplifier, respectively.

Figure 6:
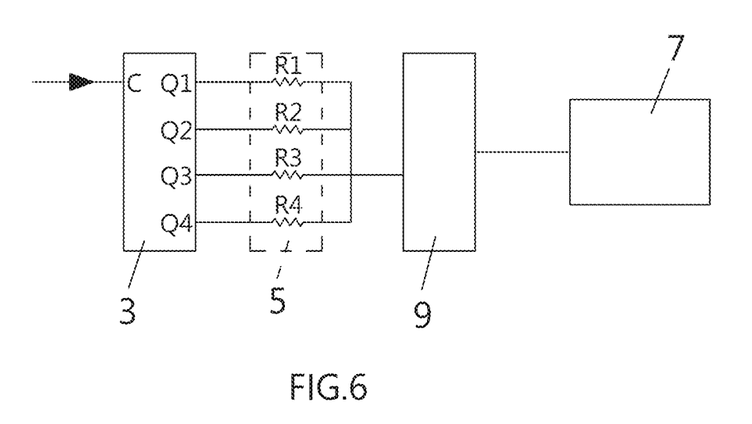
FIG. 6 is a schematic diagram showing the circuit of the driver system according to the fifth embodiment of the invention.

FIG. 6 is a schematic diagram showing the driver system according to the fifth embodiment of the invention. The driver system comprises a counter unit 3, a voltage regulation unit 5 and an operational amplifier unit 9, which differs from the embodiments above in the provision of the operational amplifier unit 9, in place of the buffer unit according to the embodiments above, for connection to the voltage regulation unit 5. The voltage regulation unit 5 is similarly provided with resistors R1~R4 connected to the first output terminals Q1, Q2, Q3, Q4, respectively. The control signal output from the activated first output terminal Q1, Q2, Q3, Q4 of the counter unit is transmitted through one of the resistors in the voltage regulation unit 5 to reach the operational amplifier unit 9, which conducts computation based on the control signal and then outputs a specific control voltage. The control voltage output is isolated due to the provision of the operational amplifier unit 9. The operational amplifier unit 9 may by way of example be a summing amplifier.

Figure 7:
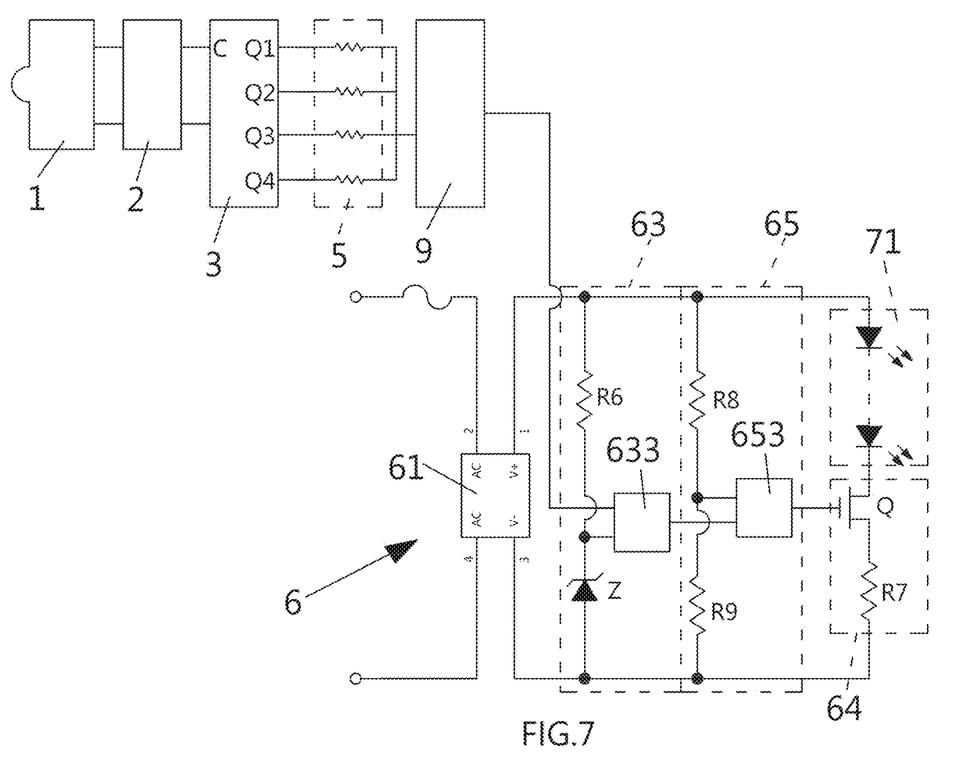
FIG. 7 is a schematic diagram showing the circuit of the driver system according to the sixth embodiment of the invention.

It is apparent to those skilled in the art that the driver system according to this embodiment may be controlled in a wired or wireless manner. For example, according to the sixth embodiment shown in FIG. 7, the driver system includes a wireless receiver unit 1 and a filter unit 2 and further includes a driver unit 6 which comprises a rectifier circuit 61, a voltage stabilization circuit 63, a voltage regulation circuit 65 and a constant current circuit 64 (same as the driver unit shown in FIG. 5). The rectifier circuit 61 is adapted to convert the AC power source into a DC power source. The voltage stabilization circuit 63 is adapted to generate a constant voltage based on the DC power source, and the first operational amplifier 633 is adapted to output a reference voltage upon receiving the constant voltage and the control voltage. The voltage regulation circuit 65 is adapted to receive and divide the DC power source into a divided voltage, and the second operational amplifier 653 is adapted to output a predetermined voltage to the transistor Q of the constant current circuit 64 upon receiving the reference voltage and the divided voltage. The transistor Q is adapted to drive the light source module upon receiving the predetermined voltage, so that the electric current flowing to the light-emitting diodes is limited to a fixed level. The second resistor R9 may also be a variable resistor, which allows manually adjusting the brightness of the light source module by changing the resistance of the variable resistor. It is also apparent to those skilled in the art that the driver unit may optionally be configured as those shown in FIG. 3 and FIG. 4.

The present invention provides a feasible driver system. The technical content and technical features of the invention have been disclosed above. However, those skilled in the art may still make various substitutions and modifications without departing from the spirit of the invention based on the disclosure provided herein. Therefore, the scope of protection of the invention should not be limited to those disclosed in the embodiments, and should include various substitutions and modifications without departing from the invention, and is covered by the following patent applications.

We claim:

1. A driver system, comprising:
   a counter unit having a first input terminal and a plurality of first output terminals, wherein the counter unit is adapted to receive a driving signal via the first input terminal and sequentially activate the first output terminals following a predetermined counting sequence, thereby outputting a control signal;
   3-state buffers electrically connected to the counter unit, comprising a plurality of second input terminals connected to the first output terminals, respectively, and a plurality of second output terminals adapted to output an isolated control signal; and
   a voltage regulation unit, comprising a plurality of resistors connected to the second output terminals, respectively, so that a corresponding control voltage for driving an electrical device is output from the resistor receiving the isolated control signal, wherein the plurality of resistors coupled to the second output terminals are connected in parallel with one another, and wherein the voltage regulation unit comprises an additional resistor connected in series with the resistors coupled to the second output terminals.

2. The driver system according to claim 1, further comprising a driver unit for driving a light source module, the driver unit comprising:
a rectifier circuit for connecting an AC power source and converting the AC power source into a DC power source; and
a switching power supply having a primary side and a secondary side, wherein the primary side is connected with the rectifier circuit and the voltage regulation unit, and wherein the secondary side is adapted to supply a predetermined voltage to drive the light source module.

3. The driver system according to claim 1, further comprising a driver unit for driving a light source module, the driver unit comprising:
a rectifier circuit for connecting an AC power source and converting the AC power source into a DC power source;
a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a predetermined voltage upon receiving the constant voltage and the control voltage; and
a constant current circuit comprising a transistor and a resistor connected in series with the transistor, wherein the transistor is adapted to drive the light source module upon receiving the predetermined voltage.

4. The driver system according to claim 1, further comprising a driver unit for driving a light source module, the driver unit comprising:
a rectifier circuit for connecting an AC power source and converting the AC power source into a DC power source;
a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a reference voltage upon receiving the constant voltage and the control voltage;
a voltage regulation circuit comprising a first resistor and a second resistor connected in series, and a second operational amplifier, wherein the serially connected first and second resistors are adapted to receive and divide the DC power source into a divided voltage, and the second operational amplifier is adapted to output a predetermined voltage upon receiving the reference voltage and the divided voltage; and
a constant current circuit comprising a transistor and a resistor connected in series with the transistor, wherein the transistors are adapted to drive the light source module upon receiving the predetermined voltage.

5. The driver system according to claim 4, wherein the second operational amplifier comprise a differential amplifier.

6. The driver system according to claim 5, wherein the first operational amplifier comprises a differential amplifier.

7. The driver system according to claim 1, wherein the counter unit comprises a Johnson counter.

8. The driver system according to claim 1, further comprising a wireless receiver unit and a filter unit, wherein the wireless receiver unit is adapted to receive a wireless signal, and wherein the filter unit is adapted to filter the wireless signal based on a specific frequency range, so that the driving signal is generated and transmitted to the counter unit.

9. The driver system according to claim 1, wherein the counter unit is adapted to receive the driving signal in a wired manner.

10. The driver system according to claim 1, wherein the counter unit is connected to a switch through a wired connection.

11. A driver system, comprising:
a counter unit having a first input terminal and a plurality of first output terminals, wherein the counter unit is adapted to receive a driving signal via the first input terminal and sequentially activate the first output terminals following a predetermined counting sequence, thereby outputting a control signal;
a voltage regulation unit, comprising a plurality of resistors connected to the first output terminals, respectively; and
an operational amplifier unit electrically connected to the voltage regulation unit and configured so that the control signal output from the activated first output terminal and transmitted through one of the resistors in the voltage regulation unit is processed to output a specific control voltage.

12. The driver system according to claim 11, further comprising a driver unit for driving a light source module, the driver unit comprising:
a rectifier circuit for connecting an AC power source and converting the AC power source into a DC power source; and
a switching power supply having a primary side and a secondary side, wherein the primary side is connected with the rectifier circuit and the operational amplifier unit, and wherein the secondary side is adapted to supply a predetermined voltage to drive the light source module.

13. The driver system according to claim 11, further comprising a driver unit for driving a light source module, the driver unit comprising:
a rectifier circuit for connecting an AC power source and converting the AC power source into a DC power source;
a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a predetermined voltage upon receiving the constant voltage and the control voltage; and
a constant current circuit comprising a transistor and a resistor connected in series with the transistor, wherein the transistor is adapted to drive the light source module upon receiving the predetermined voltage.

14. The driver system according to claim 11, further comprising a driver unit for driving a light source module, the driver unit comprising:

a rectifier circuit for connecting an AC power source and converting the AC power source into a DC power source;

a voltage stabilization circuit comprising a resistor, a Zener diode connected in series with the resistor, and a first operational amplifier, wherein the serially connected resistor and Zener diode are electrically connected to the rectifier circuit to receive the DC power source, thereby generating a constant voltage, and the first operational amplifier is adapted to output a reference voltage upon receiving the constant voltage and the control voltage;

a voltage regulation circuit comprising a first resistor and a second resistor connected in series, and a second operational amplifier, wherein the serially connected first and second resistors are adapted to receive and divide the DC power source into a divided voltage, and the second operational amplifier is adapted to output a predetermined voltage upon receiving the reference voltage and the divided voltage; and a constant current circuit comprising a transistor and a resistor connected in series with the transistor, wherein the transistors are adapted to drive the light source module upon receiving the predetermined voltage.

15. The driver system according to 11, wherein the operational amplifier unit comprises a summing amplifier.

16. The driver system according to claim 11, further comprising a wireless receiver unit and a filter unit, wherein the wireless receiver unit is adapted to receive a wireless signal, and wherein the filter unit is adapted to filter the wireless signal based on a specific frequency range, so that the driving signal is generated and transmitted to the counter unit.

17. The driver system according to claim 11, wherein the counter unit is adapted to receive the driving signal in a wired manner.

18. The driver system according to claim 11, wherein the counter unit is connected to a switch through a wired connection.

19. The driver system according to claim 11, wherein the counter unit comprises a Johnson counter.

* * * * *